United States Patent
Darvish Rouhani et al.

(10) Patent No.: US 11,886,833 B2
(45) Date of Patent: Jan. 30, 2024

(54) HIERARCHICAL AND SHARED EXPONENT FLOATING POINT DATA TYPES

(71) Applicant: Microsoft Technology Licensing, LLC, Redmond, WA (US)

(72) Inventors: Bita Darvish Rouhani, Bellevue, WA (US); Venmugil Elango, Redmond, WA (US); Rasoul Shafipour, Redmond, WA (US); Jeremy Fowers, Redmond, WA (US); Ming Gang Liu, Redmond, WA (US); Jinwen Xi, Sunnyvale, CA (US); Douglas C. Burger, Bellevue, WA (US); Eric S. Chung, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/361,263

(22) Filed: Jun. 28, 2021

(65) Prior Publication Data
US 2022/0253281 A1 Aug. 11, 2022

Related U.S. Application Data

(60) Provisional application No. 63/148,086, filed on Feb. 10, 2021.

(51) Int. Cl.
G06F 7/483 (2006.01)
H03M 7/30 (2006.01)
H03M 7/24 (2006.01)

(52) U.S. Cl.
CPC .............. *G06F 7/483* (2013.01); *H03M 7/24* (2013.01); *H03M 7/30* (2013.01)

(58) Field of Classification Search
CPC ....... G06F 7/483; G06F 7/4991–49921; G06F 7/49936; H03M 7/24; H03M 7/30
See application file for complete search history.

(56) References Cited

U.S. PATENT DOCUMENTS

2011/0099295 A1 4/2011 Wegener
2013/0007076 A1 1/2013 Wegener
(Continued)

OTHER PUBLICATIONS

Hennessy et al., "Computer Organization and Design: The Hardware/Software Interface", Fifth Edition, Chapter 2 pp. 62-174, 2014. Retrieved from <https://ict.iitk.ac.in/wp-content/uploads/CS422-Computer-Architecture-ComputerOrganizationAndDesign5thEdition2014.pdf> (Year: 2014).*
(Continued)

*Primary Examiner* — Emily E Larocque
*Assistant Examiner* — Carlo Waje
(74) *Attorney, Agent, or Firm* — Fountainhead Law Group PC

(57) ABSTRACT

Embodiments of the present disclosure include systems and methods for providing hierarchical and shared exponent floating point data types. First and second shared exponent values are determined based on exponent values of a plurality of floating point values. A third shared exponent value is determined based the first shared exponent value and the second shared exponent value. First and second difference values are determined based on the first shared exponent value, the second shared exponent value, and the third shared exponent value. Sign values and mantissa values are determined for the plurality of floating point values. The sign value and the mantissa value for each floating point value in the plurality of floating point values, the third shared exponent value, the first difference value, and the second difference value are stored in a data structure for a shared exponent floating point data type.

20 Claims, 9 Drawing Sheets

(56) References Cited

U.S. PATENT DOCUMENTS

2019/0347072 A1* 11/2019 Lo .......................... G06F 17/16
2020/0302284 A1 9/2020 Garcia Garcia

OTHER PUBLICATIONS

"International Search Report and Written Opinion Issued in PCT Application No. PCT/US22/013086", dated Apr. 11, 2022, 11 Pages.

* cited by examiner

| Value | Original exponent | Level 0 exponent | Level 1 shared exponent | Level 1 scale | Level 2 shared exponent | Level 2 scale | Total scale | Shared exponent scale | Exponent difference | Quantized 1-bit magnitude | Quantized exponent | Quantized value |
|---|---|---|---|---|---|---|---|---|---|---|---|---|
| 0.1946 | -3 | -3 | -3 | 0 | -2 | 1 | 1 | -3 | 0 | 1 | -3 | 0.125 |
| 0.1535 | -3 | -3 | | 0 | | 1 | 1 | -3 | 0 | 1 | -3 | 0.125 |
| 0.0904 | -4 | -4 | -2 | 1 | | 1 | 1 | -3 | 1 | 0 | -3 | 0 |
| 0.4727 | -2 | -2 | | 0 | | 0 | 0 | -2 | 0 | 1 | -2 | 0.25 |

FIG. 2

| 405 Value | 0.1946 | 0.1535 | 0.0904 | 0.4727 |
|---|---|---|---|---|
| 410 Original exponent | -3 | -3 | -4 | -2 |
| 415 Level shared 0 exponent | -3 | | | -2 |
| 420 Level 1 shared exponent | | -2 | | |
| 425 Level 1 scale | 1 | 1 | 0 | 0 |
| 430 Total scale | 1 | 1 | 0 | 0 |
| 435 Shared exponent scale | -3 | -3 | -2 | -2 |
| 440 Exponent difference | 0 | 0 | 2 | 0 |
| 445 Quantized 2-bit magnitude | 3 | 2 | 0 | 3 |
| 450 Quantized exponent | -3 | -3 | -2 | -2 |
| 455 Quantized value | 0.1875 | 0.125 | 0 | 0.375 |

FIG. 4

HIERARCHICAL AND SHARED EXPONENT FLOATING POINT DATA TYPES

CROSS-REFERENCE TO RELATED APPLICATION

The present application claims the benefit and priority of U.S. Provisional Application No. 63/148,086, filed Feb. 10, 2021, entitled "Hierarchical and Shared Exponent Datatypes," the entire contents of which are incorporated herein by reference in its entirety for all purposes.

BACKGROUND

The present disclosure relates to computing hardware. More particularly, the present disclosure relates to floating point data types.

A neural network is a machine learning model used for a variety of different applications (e.g., image classification, computer vision, natural language processing, speech recognition, writing recognition, etc.). A neural network may be trained for a particular purpose by running datasets through it, comparing results from the neural network to known results, and updating the network based on the differences.

Efficient training of neural networks and using neural networks for inference at low fidelity data types may require developing data types that maximize the fidelity of each bit while minimizing the computing cost. This can be formulated as an optimization problem where the goal is to maximize a quantization signal to noise ratio (QSNR) metric while minimizing the area overhead of hardware dot-product units.

BRIEF DESCRIPTION OF THE DRAWINGS

Various embodiments of the present disclosure are illustrated by way of example and not limitation in the figures of the accompanying drawings.

FIG. 2 illustrates an example of converting floating point values to a hierarchical and shared exponent floating point data type according to some embodiments.

FIG. 4 illustrates another example of converting floating point values to a hierarchical and shared exponent floating point data type according to some embodiments.

DETAILED DESCRIPTION

Figure 1:
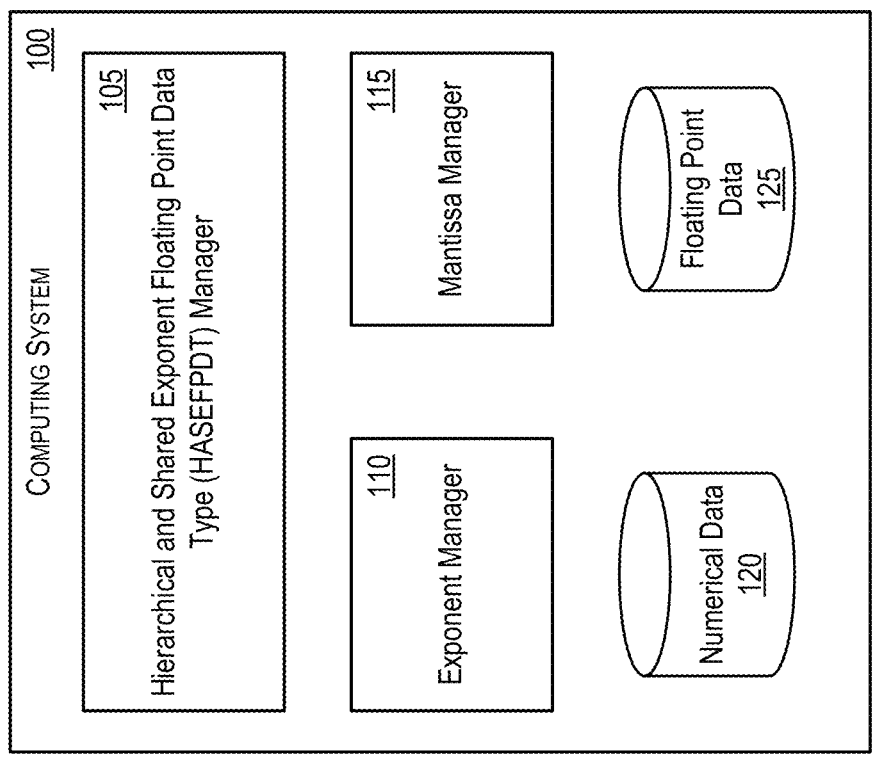
FIG. 1 illustrates a computing system according to some embodiments.

In the following description, for purposes of explanation, numerous examples and specific details are set forth in order to provide a thorough understanding of the present disclosure. Such examples and details are not to be construed as unduly limiting the elements of the claims or the claimed subject matter as a whole. It will be evident to one skilled in the art, based on the language of the different claims, that the claimed subject matter may include some or all of the features in these examples, alone or in combination, and may further include modifications and equivalents of the features and techniques described herein.

Described here are techniques for providing hierarchical and shared exponent floating point data types. In some embodiments, a computing system may be configured to create and manage hierarchical and shared exponent floating point data type data. For example, the computing system can create hierarchical and shared exponent floating point data type data from several numbers that have been, if needed, converted to floating point numbers (e.g., half precision floating point numbers, single precision floating point numbers, double precision floating point numbers, etc.). To do so, the computing system first determines the exponent value of each of the floating point numbers. Then, the computing system quantizes these exponent values based on a hierarchy of shared exponent values. Next, the computing system quantizes the mantissa of each of the floating point numbers based on the quantized exponent values. Finally, the computing system stores the hierarchy of shared exponent values and the quantized mantissas in a data structure for a hierarchical and shared exponent floating point data type.

In some embodiments, efficient training/inferencing at ultra-narrow bit-width (e.g., 1-4 bits of mantissa) may need developing datatypes that maximize the fidelity of each bit while minimizing the computing cost. This can be formulated as an optimization problem in which the goal is to maximize Quantization Signal to Noise Ratio (QSNR) while minimizing the area overhead of hardware dot-product units. As will be discussed, the hierarchical and shared exponent floating point data types described herein can push the QSNR versus multiply accumulate (MAC) area Pareto frontier further and squeeze out more efficiency compared to other floating point data types. At this ultra-narrow bit-width regime, such an increase in effective QSNR may directly translate to better achievable accuracy for both training neural networks and using them for inference.

In some embodiments, the data types described herein are shared-exponent datatypes. That is, the exponent is being shared among a few elements. The number of elements can be referred to as tile size or block size. Using small tile sizes may not be the best choice from a hardware point of view because as the number of mantissa bits are reduced, the cost of integer multipliers can be mostly eliminated and accumulators begin to dominate the total area of multiplier-accumulator (MAC) units. As such, employing a relatively large tile size allows the accumulator silicon cost to be amortized while avoiding excessive mapping of elements within a tile to zero due to the difference between their private exponent and shared exponent of the tile.

In some embodiments, the data types described herein aim to provide a balance between acceptable tile size and encoding efficiency at ultra-narrow bit-width regime. Encoding efficiency may be defined by the following equation:

$$QSNR_{dB} = 20\log_{10}\frac{\|x\|}{\|x - Q(x)\|} = 10\log_{10}\frac{\|x\|^2}{\|x - Q(x)\|^2} = 10\log_{10}\frac{\text{signal energy}}{\text{noise energy}}$$

where $Q(\cdot)$: $\Re^n \to \Re^n$ is the put forth quantization method for an n-dimensional vector x and $\|x\|$ is the Euclidean norm. n is representative of tile size in a hierarchical and shared exponent floating point data type. QSNR may be measured by averaging the aforementioned ratio over many vectors x. In some embodiments, the definition can be amended to measure signal to noise ratio for a MAC unit for which x is replaced with $x=Q(y)*Q(z^T)$ where y and z indicate the inputs to the matrix multiplication unit.

In some embodiments, a hierarchical and shared exponent floating point data type breaks down each tile into nested sub-tiles and allows the shared exponent of each sub-tile to differ from its next level sub-tile by a scale value. These scales can be implemented as right shifts in the adder tree deployed in a dot-product unit.

In some embodiments, the data types described herein have several tunable parameters. One parameter is tile size, which is the number of elements sharing a global exponent. Another parameter is the number of mantissa bits. In some embodiments, mantissa values are represented using 2's complement while, in other embodiments, mantissa values are represented using sign magnitude format. The number of mantissa bits can take any value greater than or equal to 1.

Yet another parameter is the representation of shared exponents. In some embodiments, shared exponents may be represented using a single level. For single level representations, one parameter is sub-tile size, which is the number of elements sharing a local scale to adjust the global exponent. Each tile may be split into multiple sub-tiles of equal size m, where each sub-tile shares a common sub-scale. If m=1, then right shifters can be added to the leaves of the adder tree in the dot-product unit. Larger values for m move the right shifters towards the root of the adder tree. For instance, if m=16, then right shifters are added to the $\text{Log}_2(16)=4$th level of the adder tree. Another parameter for single level representations is a sub-tile scale, which specifies the amount of right shift allowed per element. The scale encodes the maximum difference allowed between the global shared exponent and a selected exponent within a sub-tile. For instance, a scale of 1 at the leaves of the adder tree means each input element can be shifted by either 0 or 1 resulting in 2-bit combination mux. In some cases, the maximum exponent per tile can be used as the global shared exponent. As such, the scale is always a positive number greater than or equal to zero. Other exponent selection techniques can be used in some embodiments. In instances where the global shared exponent is not the maximum exponent of the tile, the selected scale can be a positive value or a negative value.

In other embodiments, shared exponents are represented in a hierarchical manner. Instead of using a large single-level shift to scale the shared exponent, the shifts are distributed into multiple levels of the adder tree and constrain the scale per shift instead. One parameter in hierarchical representations is a hierarchical level, which is the number of hierarchical levels in the adder tree to use for adjusting the shared exponent. The indexing starts from the leaves of the tree. For instance, with a tile size of 32, there will be a maximum of 5 levels in the adder tree. A hierarchical level of 3 implies using right shifts within the first three levels of the adder tree starting from the leaves. Another parameter for hierarchical representations is a sub-tile scale, which is the maximum scale per element allowed at each level. The scale encodes the difference with the next level shared exponent (not necessarily the global exponent). The shared-exponent may or may not be the maximum exponent. As an example, if the maximum and minimum exponents of a tile are computed, the difference between max and min gives the largest scale difference. If a hierarchical level is set to be 5, this (max–min) exponent difference can be capped by 5 (since there are 5 levels of sub-tiling) and the global exponent can be set to be (max–min)·clip(5)/2. This splits the tile into sub-tiles hierarchically, and at each level, for each sub-tile it checks whether the scale of −1/0/1 has to be set based on the sub-tile's exponent.

An accumulator bit-width parameter specifies the datatype used for accumulation at the end of the adder tree. Examples of such data types include a half precision floating point data type, a single precision floating point data type, a double precision floating point data type, etc. In some embodiments, the default datatype may be a single precision floating point value. Truncation bit-width can be another parameter. This parameter specifies the amount of truncation after each integer-add, which can effectively reduce area overhead. An example of an effective truncation scheme is to truncate the outputs of integer multipliers at the leaves of the adder tree to 8 bits of mantissa, and allow the bit-width of the integer adder's output at each level of the adder tree to grow by one. Such an approach, for instance, can reduce the area overhead for while minimally impacting the achievable QSNR (i.e., accuracy).

FIG. 1 illustrates a computing system 100 according to some embodiments. As shown, computing system 100 includes hierarchical and shared exponent floating point data type (HASEFPDT) manager 105, exponent manager 110, mantissa manager 115, numerical data storage 120, and floating point data storage 125. Numerical data storage 120 stores numerical data that can be converted to a hierarchical and shared exponent floating point data type. Examples of numerical data include floating point numbers, integer numbers, etc. Floating point data storage 125 is configured to store hierarchical and shared exponent floating point data types. Examples of such data types will be described in detail below. In addition, floating point data storage 125 can store definitions for hierarchical and shared exponent floating point data types.

HASEFPDT manager 105 is responsible for managing hierarchical and shared exponent floating point data types and data stored according to such data types. For instance, HASEFPDT manager 105 can create data stored as a hierarchical and shared exponent floating point data type by retrieving a definition for the hierarchical and shared exponent floating point data type from floating point data storage 125. Next, HASEFPDT manager 105 can retrieve numerical data from numerical data storage 120 and convert the numerical data to floating point numbers (e.g., half precision floating point numbers, single precision floating point numbers, double precision floating point numbers, etc.). The number of numerical data that HASEFPDT manager 105 retrieves may be based on what is specified in the definition for the hierarchical and shared exponent floating point data type. Then, HASEFPDT manager 105 sends exponent manager 110 the converted numerical data, the definition for the hierarchical and shared exponent floating point data type, and a request to determine shared exponent values for the numerical data. When HASEFPDT manager 105 receives the shared exponent values from exponent manager 110, HASEFPDT manager 105 sends mantissa manager 115 the numerical data, the shared exponent values, the definition for the hierarchical and shared exponent floating point data type, and a request to determine mantissa values for the numerical data. Once HASFPDT manager 105 receives the mantissa values from mantissa manager 115, HASEFPDT manager 105 stores the mantissa values and shared exponent values in a data structure configured to store data for the hierarchical and shared exponent floating point data type.

HASEFPDT manager 105 may also read values from hierarchical and shared exponent floating point data type data. For example, HASEFPDT manager 105 can receive (e.g., from a component operating on computing system 100, from a component operating on another computing system, etc.) a request to read a particular value from data stored according to a hierarchical and shared exponent floating point data type (e.g., a data structure for storing data according to the hierarchical and shared exponent floating point data type). In response, HASEFPDT manager 105 retrieves the mantissa value of the requested value from the hierarchical and shared exponent floating point data type data, determines the exponent value for the requested value based on the shared exponent values stored in the hierarchical and shared exponent floating point data type data, and generates the requested value based on the mantissa value and the exponent value.

Exponent manager 110 is configured to determine exponent values for hierarchical and shared exponent floating point data types. For instance, exponent manager 110 can receive from HASEFPDT manager 105 numerical data, a definition for a hierarchical and shared exponent floating point data type, and a request to determine exponent values for the numerical data. In response, exponent manager 110 determines a hierarchy of exponent values based on the numerical data and the definition for the hierarchical and shared exponent floating point data type. Then, exponent manager 110 sends the hierarchy of exponent values to HASEFPDT manager 105.

Mantissa manager 115 handles the determination of mantissa values for hierarchical and shared exponent floating point data types. For example, mantissa manager 115 may receive from HASEFPDT manager 105 numerical data, shared exponent values, a definition for the hierarchical and shared exponent floating point data type, and a request to determine mantissa values for the numerical data. Based on the shared exponent values and the definition for the hierarchical and shared exponent floating point data type, mantissa manager 115 determines mantissa values for the numerical data. Then, mantissa manager 115 sends the mantissa values to HASEFPDT manager 105.

FIG. 2 illustrates an example of converting floating point values to a hierarchical and shared exponent floating point data type according to some embodiments. Specifically, FIG. 2 illustrates table 200, which includes various values throughout the process of converting floating point values to a hierarchical and shared exponent floating point data type. This example will be described by reference to FIG. 1. For this example, the four values in row 205 will be converted to a hierarchical and shared exponent floating point data type that stores shared exponent values using a hierarchy of shared exponent values with three levels. As shown, the four values are presented as decimal values. HASEFPDT manager 105 starts by retrieving the definition for the hierarchical and shared exponent floating point data type from floating point data storage 125. Next, HASEFPDT manager 105 retrieves the values in row 205 from numerical data storage 120 and converts them into floating point values (e.g., half precision floating point values, single precision floating point values, double precision floating point values, etc.). HASEFPDT manager 105 then sends exponent manager 110 the floating point values, the definition for the hierarchical and shared exponent floating point data type, and a request to determine exponent values for the floating point values.

Upon receiving the floating point values, the definition for the hierarchical and shared exponent floating point data type, and the request, exponent manager 110 determines the exponent values of each of the floating point values, as depicted in row 210 of table 200. These exponent values are considered as level 0 exponent values in this example, as illustrated in row 215. Exponent manager 110 then determines a level 1 shared exponent value for each pair of exponent values. For this example, exponent manager 110 determines a level 1 shared exponent value by determining the exponent value in each pair of exponent values that has the highest value and using it as the level 1 shared exponent value. As shown in row 220, the highest exponent value between the exponent values for the first pair of values is −3. The highest exponent value between the exponent values for the second pair of values is −2. Next, exponent manager 110 determines a level 1 scale value for each pair of level 0 exponent value and corresponding level 1 shared exponent value. Here, exponent manager 110 determines a level 1 scale value by determining the difference between a level 0 exponent value and a corresponding level 1 shared exponent value. If the difference is greater than 1, exponent manager 110 approximates the level 1 scale value to be 1.

For the first and second pairs of level 0 exponent value and corresponding level 1 shared exponent values, and second values, exponent manager 110 determines the level 1 scale value to each be 0 (i.e., the difference between −3 and −3 is 0). For the third pair of level 0 exponent value and corresponding level 1 shared exponent value, exponent manager 110 determines the difference is between the level 0 exponent value and the level 1 shared exponent value to be 2. Since this is greater than 1, exponent manager 110 approximates the level 1 scale value to be 1. For the fourth pair of level 0 exponent value and corresponding level 1 shared exponent value, exponent manager 110 determines the level 1 scale value to be 0 (i.e., the difference between −2 and −2 is 0). The level 1 scale values are depicted in row 225 of table 200.

After determining level 1 shared exponent values and scale values, exponent manager 110 determines level 2 shared exponent values. In this example, exponent manager 110 determines a level 2 shared exponent value based on the level 1 shared exponent value. In particular, exponent manager 110 determines a level 2 shared exponent value by determining the exponent value in the level 1 shared exponent values that has the highest value and using it as the level 2 shared exponent value. Here, exponent manager 110 determines the level 2 shared exponent value as being −2, as shown in row 230.

Next, exponent manager 110 determines a level 2 scale value for each pair of level 1 shared exponent value and corresponding level 2 shared exponent value. For this example, exponent manager 110 determines a level 2 scale value by determining the difference between a level 1 shared exponent value and a corresponding level 2 shared exponent value. If the difference is greater than 1, exponent manager 110 approximates the level 2 scale value to be 1. For the first pair of level 1 shared exponent value and corresponding level 2 shared exponent value, exponent manager 110 determines a level 2 scale value to be 1 (i.e., the difference between −2 and −3 is 1). For the second pair of level 1 shared exponent value and corresponding level 2 shared exponent value, exponent manager 110 determines a level 2 scale value to be 0 (i.e., the difference between −2 and −2 is 0). The level 2 scale values are shown in row 235. Row 240 depicts the total scale value for each floating point value, which is the sum of the level 1 scale value and the level 2 scale value. Row 245 illustrates the total shared exponent scale value for each floating point value, which is the exponent value determined for the floating point value by subtracting the respective total scale value from the level 2 shared exponent value. Row 250 depicts the difference between the determined exponent value and the original exponent value for each floating point value. Row 255 shows the quantized magnitude of the mantissa for the floating point value. In this example, a 2-bit mantissa is used with a first bit for the sign (not shown in table 200) and a second bit for the magnitude. Row 260 illustrates the quantized exponent value for each of the floating point values, which is the same as the shared exponent scale values in row 245. Finally, row 265 shows the decimal representations of the quantized floating point values after converting the original floating point values to the hierarchical and shared exponent floating point data type.

After exponent manager 110 determines the level 2 shared exponent, the level 2 scale values, and the level 1 scale values, exponent manager 110 sends them to HASEFPDT manager 105. Then, HASEFPDT manager 105 sends mantissa manager 115 the floating point values in row 205, the level 2 shared exponent, the level 2 scale values, the level 1 scale values, the definition for the hierarchical and shared exponent floating point data type, and a request to determine mantissa values for the floating point values. When mantissa manager 115 receives the data and the request, mantissa manager 115 determines a mantissa value for each floating point value. If the exponent difference (shown in row 250) is greater than 0, mantissa manager 115 quantizes the magnitude of the mantissa for the respective floating point value to 0. Otherwise, mantissa manager 115 uses the available bits (one bit for the sign and one bit for the magnitude in this example) and respective quantized exponent value (shown in row 260) to best approximate the original floating point value. Here, mantissa manager 115 determines the quantized magnitude values for each of the floating point values to be those depicted in row 255. Next, mantissa manager 115 sends the determined mantissa values to HASEFPDT manager 105.

Figure 3:
FIG. 3 illustrates an example data structure for storing the hierarchical and shared exponent floating point data type illustrated in FIG. 2 according to some embodiments.

Once HASEFPDT manager 105 receives the mantissa values from mantissa manager 115, HASEFPDT manager 105 stores the mantissa values, the level 2 shared exponent, the level 2 scale values, and the level 1 scale values in a data structure configured to store data for the hierarchical and shared exponent floating point data type. FIG. 3 illustrates an example data structure 300 for storing the hierarchical and shared exponent floating point data type illustrated in FIG. 2 according to some embodiments. Data structure 300 may be generated based on the definition for the hierarchical and shared exponent floating point data type. Here, the definition for the data type would specify four 2-bit mantissa values for four floating point values, four 1-bit level 1 scale values, two 1-bit level 2 scale values, and an 8-bit level 2 shared exponent value. As shown, data structure 300 includes four attributes: a mantissa attribute, a level 1 scale attribute, a level 2 scale attribute, and a shared exponent attribute. The mantissa attribute stores a 2-bit mantissa value determined for each of the floating point values. The level 1 scale attribute stores a 1-bit level 1 scale value determined for each of the floating point values. The level 2 scale value attribute stores a 1-bit level 2 scale value determined for each pair of floating point values. The shared exponent attribute value stores an 8-bit level 2 shared exponent value determined for the floating point values. In this example, the value of the level 2 shared exponent value is represented using a bias of 127. Therefore, a value of 125 (i.e., 127+(−2)) is stored in the shared exponent attribute for this example.

FIG. 4 illustrates another example of converting floating point values to a hierarchical and shared exponent floating point data type according to some embodiments. In particular, FIG. 4 illustrates table 400, which includes various values throughout the process of converting floating point values to a different hierarchical and shared exponent floating point data type. This example will also be described by reference to FIG. 1. In this example, the same four values, which are depicted in row 405, used in the example above will be converted to a hierarchical and shared exponent floating point data type that stores shared exponent values using a hierarchy of shared exponent values with two levels. The example begins by HASEFPDT manager 105 retrieving the definition for the hierarchical and shared exponent floating point data type from floating point data storage 125. HASEFPDT manager 105 then retrieves the values in row 405 from numerical data storage 120 and converts them into floating point values (e.g., half precision floating point values, single precision floating point values, double precision floating point values, etc.). Next, HASEFPDT manager 105 sends exponent manager 110 the floating point values, the definition for the hierarchical and shared exponent floating point data type, and a request to determine exponent values for the floating point values.

After receiving the floating point values, the definition for the hierarchical and shared exponent floating point data type, and the request, exponent manager 110 determines the exponent values of each of the floating point values, as shown in row 410. For this example, exponent manager 110 shared exponent values for each pair of original exponent values as level 0 shared exponents. In this example, exponent manager 110 determines a level 0 shared exponent value by determining the exponent value in each pair of original exponent values that has the highest value and using it as the level 0 shared exponent value. As illustrated in row 415, the highest exponent value between the exponent values for the first pair of values is −3 and the highest exponent value between the exponent values for the second pair of values is −2. Exponent manager 110 then determines a level 1 shared exponent based on the level 0 shared exponent values. For this example, exponent manager 110 determines the level 1 shared exponent by determining the level 0 shared exponent value that has the highest value and using it as the level 1 shared exponent value. Here, exponent manager 110 determines that the level 1 shared exponent value is −2, as shown in row 420. Next, exponent manager 110 determines a level 1 scale value for each pair of level 0 shared exponent value and corresponding level 1 shared exponent value. In this example, exponent manager 110 determines a level 1 scale value by determining the difference between a level 0 shared exponent value and a corresponding level 1 shared exponent value. If the difference is greater than 1, exponent manager 110 approximates the level 1 scale value to be 1.

For the first pair of level 0 shared exponent value and corresponding level 1 shared exponent value, exponent manager 110 determines a level 1 scale value to be 1 (i.e., the difference between −2 and −3 is 1). For the second pair of level 0 shared exponent value and corresponding level 1 shared exponent value, exponent manager 110 determines a level 1 scale value to be 0 (i.e., the difference between −2 and −2 is 0). The level 1 scale values are shown in row 425. Row 430 depicts the total scale value, which is the same as the level 1 scale value. Row 435 illustrates the total shared exponent scale value for each floating point value, which is the exponent value determined for the floating point value by subtracting the respective total scale value from the level 1 shared exponent value. Row 440 depicts the difference between the determined exponent value and the original exponent value for each floating point value. Row 445 illustrates the quantized magnitude of the mantissa for the floating point value. In this example, a 3-bit mantissa is used with a first bit for the sign (not shown in table 400) and a second bit for the magnitude. Row 450 shows the quantized exponent value for each of the floating point values, which is the same as the shared exponent scale values in row 435. Then, row 455 depicts the decimal representations of the quantized floating point values after converting the original floating point values to the hierarchical and shared exponent floating point data type.

Upon determining the level 1 shared exponent and the level 1 scale values, exponent manager 110 sends them to HASEFPDT manager 105. HASEFPDT manager 105 sends mantissa manager 115 the floating point values in row 405, the level 1 shared exponent, the level 1 scale values, the definition for the hierarchical and shared exponent floating point data type, and a request to determine mantissa values for the floating point values. Once mantissa manager 115 receives the data and the request, mantissa manager 115 determines a mantissa value for each floating point value. If the exponent difference (shown in row 440) is greater than 1, mantissa manager 115 quantizes the magnitude of the mantissa for the respective floating point value to 0. Otherwise, mantissa manager 115 uses the available bits (one bit for the sign and one bit for the magnitude in this example) and respective quantized exponent value (shown in row 450) to best approximate the original floating point value. Mantissa manager 115 determines the quantized magnitude values for each of the floating point values to be those shown in row 445. Then, mantissa manager 115 sends the determined mantissa values to HASEFPDT manager 105.

Figure 5:
FIG. 5 illustrates an example data structure for storing the hierarchical and shared exponent floating point data type illustrated in FIG. 4 according to some embodiments.

When HASEFPDT manager 105 receives the mantissa values from mantissa manager 115, HASEFPDT manager 105 stores the mantissa values, the level 1 shared exponent, and the level 1 scale values in a data structure configured to store data for the hierarchical and shared exponent floating point data type. FIG. 5 illustrates an example data structure 500 for storing the hierarchical and shared exponent floating point data type illustrated in FIG. 4 according to some embodiments. Data structure 500 can be generated based on the definition for the hierarchical and shared exponent floating point data type. For this example, the definition for the data type would specify four 2-bit mantissa values for four floating point values, two 2-bit level 1 scale values, and an 8-bit level 1 shared exponent value. As depicted, data structure 500 includes three attributes: a mantissa attribute, a level 1 scale attribute, and a shared exponent attribute. The mantissa attribute stores a 2-bit mantissa value determined for each of the floating point values. The level 1 scale attribute stores a 2-bit level 1 scale value determined for each of the floating point values. The shared exponent attribute value stores an 8-bit level 1 shared exponent value determined for the floating point values. In this example, the value of the level 1 shared exponent value is represented using a bias of 127. As such, a value of 125 (i.e., 127+(−2)) is stored in the shared exponent attribute for this example.

The examples described above by reference to FIGS. 1-5 demonstrate how floating point numbers can be converted into two different hierarchical and shared exponent floating point data types. One of ordinary skill in the art will appreciate that additional and/or different hierarchical and shared exponent floating point data types may be used in some embodiments. For example, hierarchical and shared exponent floating point data types can represent a different number of floating point values that share exponents (the examples above each represent four floating point values), use different numbers of bits to represent mantissa values, level scale values, and shared exponent values, use a different number of levels in the hierarchy of exponent values (e.g., a different number of levels of scale values), etc.

Additionally, the examples explained above by reference to FIGS. 2-5 show how a hierarchy of shared exponent values can be represented by the highest level shared exponent and level scale values. For example, the example illustrated in FIG. 2 uses a hierarchy of shared exponents with three different levels: level 0 exponent values, level 1 shared exponent values, and a level 2 shared exponent value. As depicted by FIG. 3, the hierarchy of shared exponent values is represented by the level 2 shared exponent value, the level 2 scale values, and the level 1 scale values. The quantized exponent value of a floating point value (the values in row 260) can be determined from the level 2 shared exponent value, the level 2 scale values, and the level 1 scale values. As another example, the example illustrated in FIG. 4 uses a hierarchy of shared exponents with two different levels: level 0 exponent values and a level 1 shared exponent value. As illustrated by FIG. 5, the hierarchy of shared exponent values is represented by the level 1 shared exponent value and the level 1 scale values. The quantized exponent value of a floating point value (the values in row 450) may be determined from the level 1 shared exponent value and the level 1 scale values. HASEFPDT manager 105 determines quantized exponent values in this manner when reading a floating point value (e.g., determining the quantized value like those shown in rows 265 and 455) stored according to a hierarchical and shared exponent floating point data type.

Moreover, the examples described above by reference to FIGS. 2-5 determine shared exponent values by selecting the highest value among lower level exponents/shared exponents. One of ordinary skill in the art will understand that additional and/or different statistical metrics may be used to determine a shared exponent value for a particular level. Examples of such metrics include weighted average, mean plus a defined number of standard deviations (e.g., one standard deviation, two standard deviations, three standard deviations, etc.).

Figure 6:
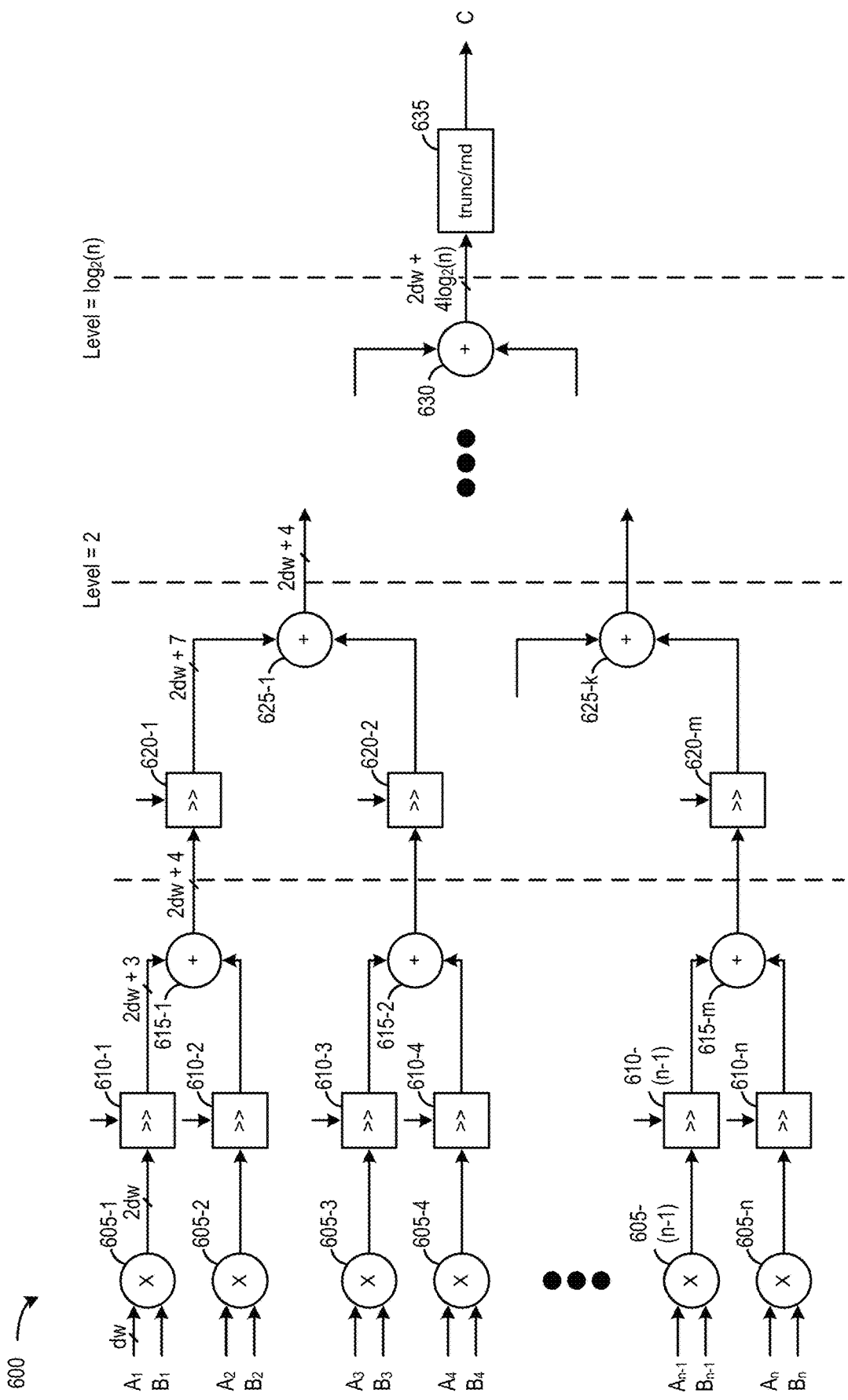
FIG. 6 illustrates an example of multiplying hierarchical and shared exponent floating point data type variables according to some embodiments.

Example Application of Hierarchical and Shared Exponent Floating Point Data Types The examples described above explain how to create hierarchical and shared exponent floating point data types. The following example illustrates one of many applications of these data types. FIG. 6 illustrates an example of multiplying hierarchical and shared exponent floating point data type variables according to some embodiments. Specifically, FIG. 6 illustrates a hardware architecture 600 for performing a dot product between two variables stored according to a hierarchical and shared exponent floating point data type. In some embodiments, hardware architecture 600 can be used to implement an artificial intelligence (AI) accelerator used to train neural networks and use neural networks for inference. As shown, hardware architecture 600 includes multipliers 605-1-605-$n$, shifters 610-1-610-$n$ and 620-1-620-$m$, adders 615-1-615-$m$, 625-1-625-$k$, and 630, and truncate/rounding module 635.

For this example, hardware architecture 600 is configured to receive two inputs A and B. Each of the inputs A and B is a hierarchical and shared exponent floating point data type variable that stores n number of floating point values (e.g., data structure 300, data structure 500, etc.). The mantissa values of the floating point values in each variable are input into corresponding multipliers 605. For instance, the mantissa value of the first floating point value in variable A and the mantissa value of the first floating point value in variable B are input into multiplier 605-1, the mantissa value of the second floating point value in variable A and the mantissa value of the second floating point value in variable B are input into multiplier 605-2, the mantissa value of the third floating point value in variable A and the mantissa value of the third floating point value in variable B are input into multiplier 605-3, etc. As illustrated, the input in each of the multipliers 605 has a bit width of dw. Each multiplier 605 multiplies the two input mantissa values and outputs a produce having a bit width of 2dw. The output of a multiplier 605 is input into a corresponding shifter 610, which is configured to perform right shifts based on a control input depicted at the top of the shifter 610. The control input for a shifter 610 is the sum of the level 1 scale values of each of the inputs to multiplier 605. A shifter 610 performs a number of right shift operations equal to the value of the control input. The output of a shifter 610 has a bit width of 2dw+3. The output of two shifters 610 are input into a corresponding adder 615, which adds the two inputs together to produce a sum with a bit width of 2dw+4. The process continues using the corresponding level scale values to control shifters (e.g., the sum of level 2 scale values are used to control shifters 620-1-620-$m$). The number of levels is determined by log 2(n). As mentioned above, n is the number of floating point values stored in a variable. The output of the last level has a bit width of 2dw+4 $\log_2(n)$.

When truncate/rounding module 635 receives the output from the last level, truncate/rounding module 635 performs shift operations on the value of the output based on the sum of the shared exponent values of each of the variables. For example, if the sum of the shared exponent values is a positive value, truncate/rounding module 635 performs a number of left shift operations on the value equal to the sum of the shared exponent values. If the sum of the shared exponent values is a negative value, truncate/rounding module 635 performs a number of right shift operations on the value equal to the absolute value of the sum of the shared exponent values. Then, truncate/rounding module 635 truncates the value to a defined number of bits to produce output value C.

Figure 7:
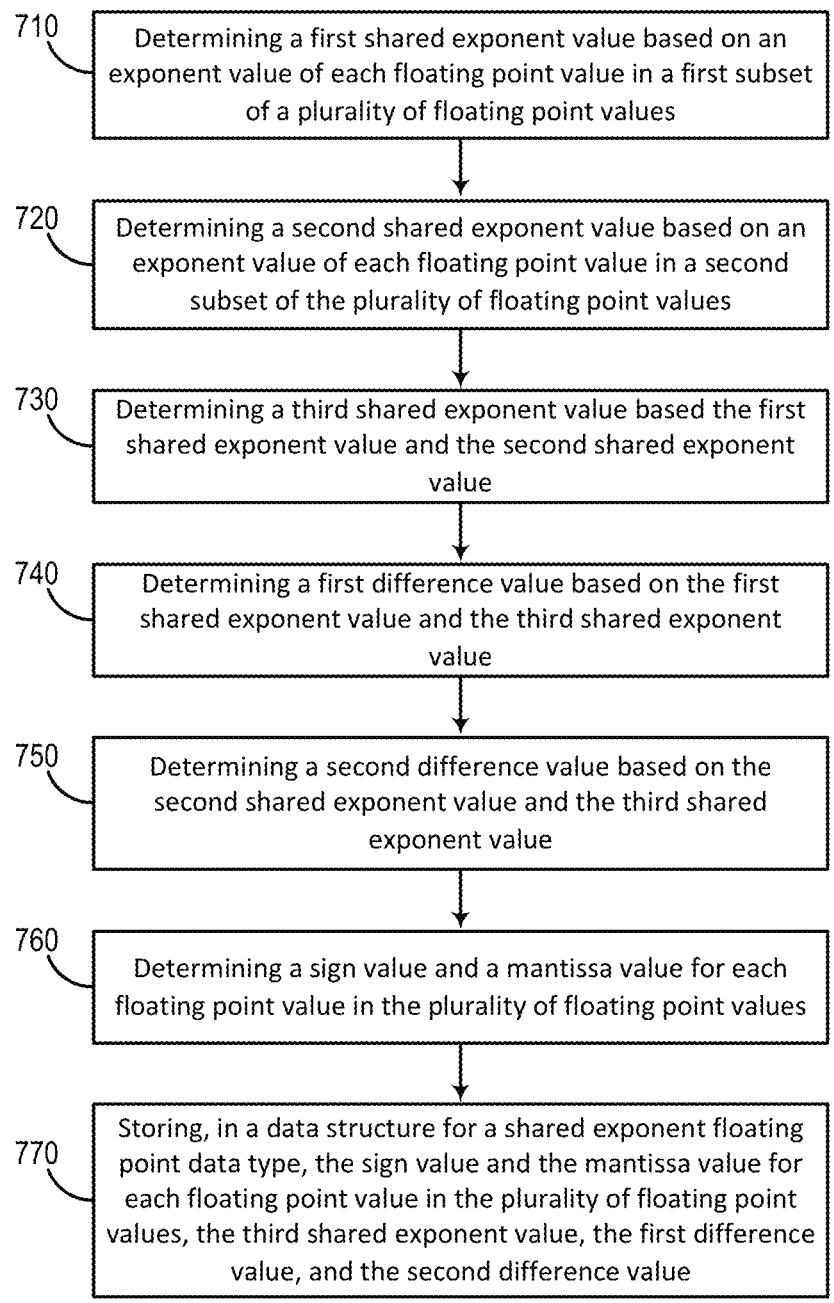
FIG. 7 illustrates a process for creating a hierarchical and shared exponent floating point data type variable according to some embodiments.

FIG. 7 illustrates a process 700 for creating a hierarchical and shared exponent floating point data type variable according to some embodiments. In some embodiments, computing system 100 performs process 700. Process 700 starts by determining, at 710, a first shared exponent value based on an exponent value of each floating point value in a first subset of a plurality of floating point values. Referring to FIGS. 1 and 4 as an example, exponent manager 110 may determine a level 0 shared exponent value based on the original exponent values of the first pair of floating point values.

Next, process 700 determines, at 720, a second shared exponent value based on an exponent value of each floating point value in a second subset of the plurality of floating point values. Referring to FIGS. 1 and 4 as an example, exponent manager 110 can determine a level 0 shared exponent value based on the original exponent values of the second pair of floating point values.

Process 700 then determines, at 730, a third shared exponent value based the first shared exponent value and the second shared exponent value. Referring to FIGS. 1 and 4 as an example, exponent manager 110 may determine a level 1 shared exponent value based on the level 0 shared exponent values.

At 740, process 700 determines a first difference value based on the first shared exponent value and the third shared exponent value. Referring to FIGS. 1 and 4 as an example, exponent manager 110 can determine a level 1 scale value for the first pair of level 0 shared exponent value and corresponding level 1 shared exponent value. Then, process 700 determines, at 750, a second difference value based on the second shared exponent value and the third shared exponent value. Referring to FIGS. 1 and 4 as an example, exponent manager 110 can determine a level 1 scale value for the second pair of level 0 shared exponent value and corresponding level 1 shared exponent value.

Next, process 700 determines, at 760, a sign value and a mantissa value for each floating point value in the plurality of floating point values. Referring to FIGS. 1 and 4 as an example, mantissa manager 115 may determine quantized magnitude values for the mantissas, as shown in row 445 of table 400. At 770, process 700 finally stores, in a data structure for a shared exponent floating point data type, the sign value and the mantissa value for each floating point value in the plurality of floating point values, the third shared exponent value, the first difference value, and the second difference value. Referring to FIGS. 1 and 5 as an example, HASEFPDT manager 105 stores the mantissa values, the level 1 shared exponent, and the level 1 scale values in a data structure 500.

Figure 8:
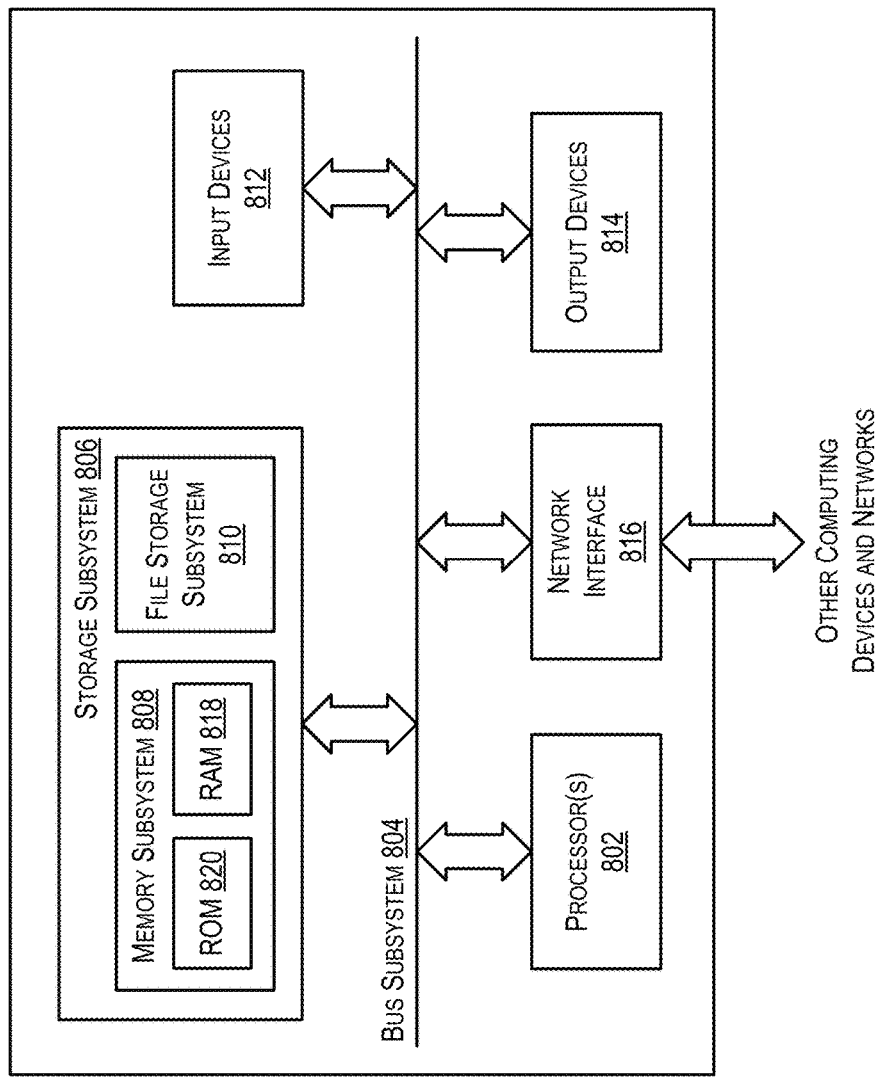
FIG. 8 depicts a simplified block diagram of an example computer system according to some embodiments.

The techniques describe above may be implemented in a wide range of computer systems configured to process neural networks. FIG. 8 depicts a simplified block diagram of an example computer system 800, which can be used to implement the techniques described in the foregoing disclosure (e.g., computing system 100). As shown in FIG. 8, computer system 800 includes one or more processors 802 that communicate with a number of peripheral devices via a bus subsystem 804. These peripheral devices may include a storage subsystem 806 (e.g., comprising a memory subsystem 808 and a file storage subsystem 810) and a network interface subsystem 816. Some computer systems may further include user interface input devices 812 and/or user interface output devices 814.

Bus subsystem 804 can provide a mechanism for letting the various components and subsystems of computer system 800 communicate with each other as intended. Although bus subsystem 804 is shown schematically as a single bus, alternative embodiments of the bus subsystem can utilize multiple busses.

Network interface subsystem 816 can serve as an interface for communicating data between computer system 800 and other computer systems or networks. Embodiments of network interface subsystem 816 can include, e.g., Ethernet, a Wi-Fi and/or cellular adapter, a modem (telephone, satellite, cable, ISDN, etc.), digital subscriber line (DSL) units, and/or the like.

Storage subsystem 806 includes a memory subsystem 808 and a file/disk storage subsystem 810. Subsystems 808 and 810 as well as other memories described herein are examples of non-transitory computer-readable storage media that can store executable program code and/or data that provide the functionality of embodiments of the present disclosure.

Memory subsystem 808 includes a number of memories including a main random access memory (RAM) 818 for storage of instructions and data during program execution and a read-only memory (ROM) 820 in which fixed instructions are stored. File storage subsystem 810 can provide persistent (e.g., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art.

It should be appreciated that computer system 800 is illustrative and many other configurations having more or fewer components than system 800 are possible.

Figure 9:
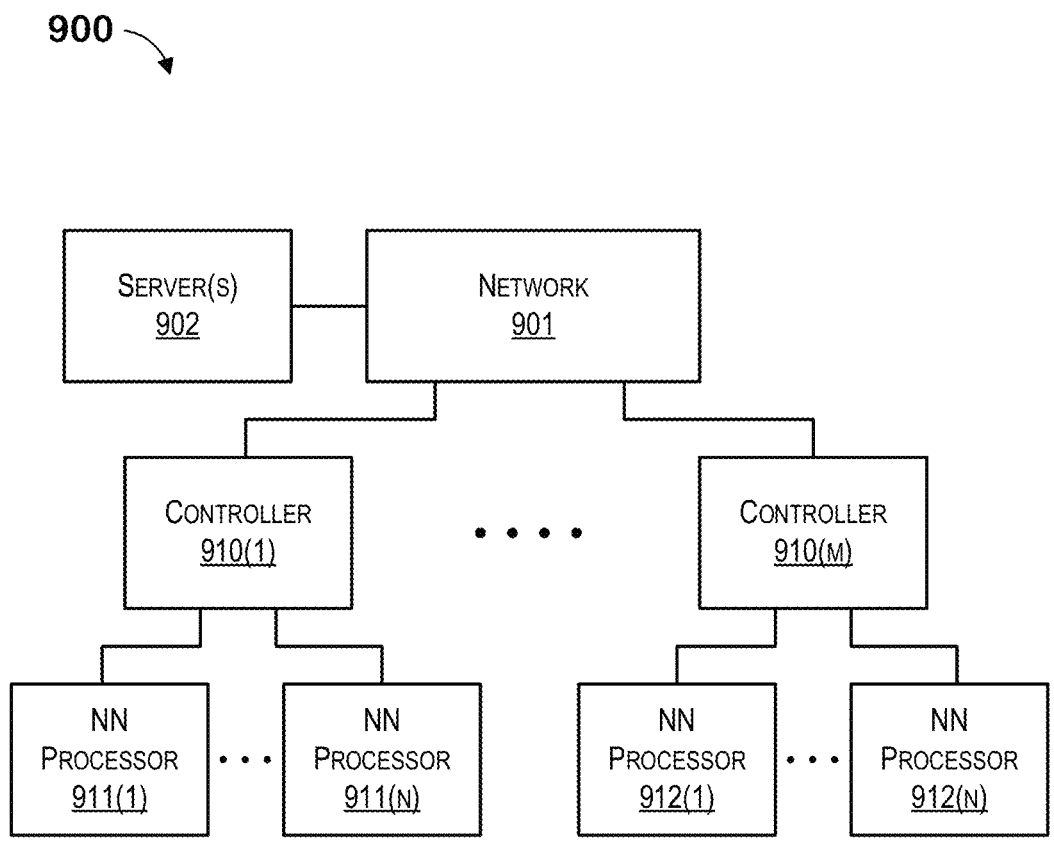
FIG. 9 illustrates a neural network processing system according to some embodiments.

FIG. 9 illustrates a neural network processing system according to some embodiments. In various embodiments, neural networks according to the present disclosure may be implemented and trained in a hardware environment comprising one or more neural network processors. A neural network processor may refer to various graphics processing units (GPU) (e.g., a GPU for processing neural networks produced by Nvidia Corp®), field programmable gate arrays (FPGA) (e.g., FPGAs for processing neural networks produced by Xilinx®), or a variety of application specific integrated circuits (ASICs) or neural network processors comprising hardware architectures optimized for neural network computations, for example. In this example environment, one or more servers 902, which may comprise architectures illustrated in FIG. 8 above, may be coupled to a plurality of controllers 910(1)-910(M) over a communication network 901 (e.g. switches, routers, etc.). Controllers 910(1)-910(M) may also comprise architectures illustrated in FIG. 8 above. Each controller 910(1)-910(M) may be coupled to one or more NN processors, such as processors 911(1)-911(N) and 912(1)-912(N), for example. NN processors 911(1)-911(N) and 912(1)-912(N) may include a variety of configurations of functional processing blocks and memory optimized for neural network processing, such as training or inference. The NN processors are optimized for neural network computations. Server 902 may configure controllers 910 with NN models as well as input data to the models, which may be loaded and executed by NN processors 911(1)-911(N) and 912(1)-912(N) in parallel, for example. Models may include layers and associated weights as described above, for example. NN processors may load the models and apply the inputs to produce output results. NN processors may also implement training algorithms described herein, for example.

Further Example Embodiments

In various embodiments, the present disclosure includes systems, methods, and apparatuses for providing hierarchical and shared exponent floating point data types. The techniques described herein may be embodied in non-transitory machine-readable medium storing a program executable by a computer system, the program comprising sets of instructions for performing the techniques described herein. In some embodiments, a system includes a set of processing units and a non-transitory machine-readable medium storing instructions that when executed by at least one processing unit in the set of processing units cause the at least one processing unit to perform the techniques described above. In some embodiments, the non-transitory machine-readable medium may be memory, for example, which may be coupled to one or more controllers or one or more artificial intelligence processors, for example.

The following techniques may be embodied alone or in different combinations and may further be embodied with other techniques described herein.

For example, in one embodiment, the present disclosure includes a non-transitory machine-readable medium storing a program executable by at least one processing unit of a device. The program comprising sets of instructions for determining a first shared exponent value based on an exponent value of each floating point value in a first subset of a plurality of floating point values; determining a second shared exponent value based on an exponent value of each floating point value in a second subset of the plurality of floating point values; determining a third shared exponent value based the first shared exponent value and the second shared exponent value; determining a first difference value based on the first shared exponent value and the third shared exponent value; determining a second difference value based on the second shared exponent value and the third shared exponent value; determining a sign value and a mantissa value for each floating point value in the plurality of floating point values; and storing, in a data structure for a shared exponent floating point data type, the sign value and the mantissa value for each floating point value in the plurality of floating point values, the third shared exponent value, the first difference value, and the second difference value.

In one embodiment, the first shared exponent value, the second shared exponent value, and the third shared exponent value form a hierarchy of shared exponent values.

In one embodiment, the first shared exponent value and the second shared exponent value are first level exponent values in the hierarchy of shared exponent values, wherein the third shared exponent value is a second level exponent value in the hierarchy of shared exponent values.

In one embodiment, the hierarchy of shared exponent values are represented by the third shared exponent value, the first difference value, and the second difference value.

In one embodiment, the present disclosure further determining a first set of difference values based on the first shared exponent value and the exponent value of each floating point number in the first subset of the plurality of floating point values; determining a second set of difference values based on the second shared exponent value and the exponent value of each floating point number in the second subset of the plurality of floating point values; and storing, in the data structure for the shared exponent floating point data type, the first set of different values and the second set of difference values.

In one embodiment, determining the first shared exponent value comprises determining an exponent value of a floating point value in the first subset of a plurality of floating point values having a highest value and using the exponent value as the first shared exponent value.

In one embodiment, determining the second shared exponent value comprises determining an exponent value of a floating point value in the second subset of a plurality of floating point values having a highest value and using the exponent value as the second shared exponent value.

In one embodiment, determining the third shared exponent value comprises, upon determining that the first shared exponent value is greater than or equal to the second shared exponent value, using the first shared exponent value as the third exponent value, and, upon determining that the first shared exponent value is less than the second shared exponent value, using the second shared exponent value as the third exponent value.

In one embodiment, a number of bits used to represent the mantissa values stored in the data structure for the shared exponent floating point data type is less than a number of bits used to represent the third exponent value.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A non-transitory machine-readable medium storing a program executable by at least one processing unit of a device, the program comprising sets of instructions for:
   determining a first shared exponent value based on an exponent value of each floating point value in a first subset of a plurality of floating point values;
   determining a second shared exponent value based on an exponent value of each floating point value in a second subset of the plurality of floating point values;
   determining a third shared exponent value based the first shared exponent value and the second shared exponent value;
   determining a first difference value based on the first shared exponent value and the third shared exponent value;
   determining a second difference value based on the second shared exponent value and the third shared exponent value;
   determining a sign value and a mantissa value for each floating point value in the plurality of floating point values;
   storing, in a data structure for a shared exponent floating point data type, the sign value and the mantissa value for each floating point value in the plurality of floating point values, the third shared exponent value, the first difference value, and the second difference value; and
   providing the data structure as an input to a set of hardware components, the set of hardware components configured to perform a set of operations on the plurality of floating point values based on the data structure for the shared exponent floating point data type and generate an output based on the set of operations, the set of hardware components comprising a set of multipliers for performing multiplication operations on the mantissa values of the plurality of floating point values to generate a plurality of products, a first set of shifters for performing shifting operations on the plurality of products based on the first difference value and the second difference value to generate a first plurality of shifted values, a first set of adders for adding the first plurality of shifted values to generate a plurality of sums, a second set of shifters for performing shifting operations on the plurality of sums to generate a second plurality of shifted values, and a second set of adders for adding the second plurality of shifted values to generate a set of sums.

2. The non-transitory machine-readable medium of claim 1, wherein the first shared exponent value, the second shared exponent value, and the third shared exponent value form a hierarchy of shared exponent values.

3. The non-transitory machine-readable medium of claim 2, wherein the first shared exponent value and the second shared exponent value are first level exponent values in the hierarchy of shared exponent values, wherein the third shared exponent value is a second level exponent value in the hierarchy of shared exponent values.

4. The non-transitory machine-readable medium of claim 2, wherein the hierarchy of shared exponent values are represented by the third shared exponent value, the first difference value, and the second difference value.

5. The non-transitory machine-readable medium of claim 1, wherein the program further comprises sets of instructions for:
   determining a first set of difference values based on the first shared exponent value and the exponent value of each floating point number in the first subset of the plurality of floating point values;
   determining a second set of difference values based on the second shared exponent value and the exponent value of each floating point number in the second subset of the plurality of floating point values; and
   storing, in the data structure for the shared exponent floating point data type, the first set of different values and the second set of difference values.

6. The non-transitory machine-readable medium of claim 1, wherein determining the first shared exponent value comprises determining an exponent value of a floating point value in the first subset of a plurality of floating point values having a highest value and using the exponent value as the first shared exponent value.

7. The non-transitory machine-readable medium of claim 1, wherein determining the second shared exponent value comprises determining an exponent value of a floating point value in the second subset of a plurality of floating point values having a highest value and using the exponent value as the second shared exponent value.

8. The non-transitory machine-readable medium of claim 1, wherein determining the third shared exponent value comprises, upon determining that the first shared exponent value is greater than or equal to the second shared exponent value, using the first shared exponent value as the third shared exponent value, and, upon determining that the first shared exponent value is less than the second shared exponent value, using the second shared exponent value as the third shared exponent value.

9. The non-transitory machine-readable medium of claim 1, wherein a number of bits used to represent the mantissa values stored in the data structure for the shared exponent floating point data type is less than a number of bits used to represent the third shared exponent value.

10. A method comprising:
   determining a first shared exponent value based on an exponent value of each floating point value in a first subset of a plurality of floating point values;
   determining a second shared exponent value based on an exponent value of each floating point value in a second subset of the plurality of floating point values;
   determining a third shared exponent value based the first shared exponent value and the second shared exponent value;
   determining a first difference value based on the first shared exponent value and the third shared exponent value;

determining a second difference value based on the second shared exponent value and the third shared exponent value;

determining a sign value and a mantissa value for each floating point value in the plurality of floating point values;

storing, in a data structure for a shared exponent floating point data type, the sign value and the mantissa value for each floating point value in the plurality of floating point values, the third shared exponent value, the first difference value, and the second difference value; and providing the data structure as an input to a set of hardware components, the set of hardware components configured to perform a set of operations on the plurality of floating point values based on the data structure for the shared exponent floating point data type and generate an output based on the set of operations, the set of hardware components comprising a set of multipliers for performing multiplication operations on the mantissa values of the plurality of floating point values to generate a plurality of products, a first set of shifters for performing shifting operations on the plurality of products based on the first difference value and the second difference value to generate a first plurality of shifted values, a first set of adders for adding the first plurality of shifted values to generate a plurality of sums, a second set of shifters for performing shifting operations on the plurality of sums to generate a second plurality of shifted values, and a second set of adders for adding the second plurality of shifted values to generate a set of sums.

11. The method of claim 10, wherein the first shared exponent value, the second shared exponent value, and the third shared exponent value form a hierarchy of shared exponent values.

12. The method of claim 11, wherein the first shared exponent value and the second shared exponent value are first level exponent values in the hierarchy of shared exponent values, wherein the third shared exponent value is a second level exponent value in the hierarchy of shared exponent values.

13. The method of claim 11, wherein the hierarchy of shared exponent values are represented by the third shared exponent value, the first difference value, and the second difference value.

14. The method of claim 10 further comprising:
determining a first set of difference values based on the first shared exponent value and the exponent value of each floating point number in the first subset of the plurality of floating point values;

determining a second set of difference values based on the second shared exponent value and the exponent value of each floating point number in the second subset of the plurality of floating point values; and storing, in the data structure for the shared exponent floating point data type, the first set of different values and the second set of difference values.

15. The method of claim 10, wherein determining the first shared exponent value comprises determining an exponent value of a floating point value in the first subset of a plurality of floating point values having a highest value and using the exponent value as the first shared exponent value.

16. The method of claim 10, wherein determining the second shared exponent value comprises determining an exponent value of a floating point value in the second subset of a plurality of floating point values having a highest value and using the exponent value as the second shared exponent value.

17. The method of claim 10, wherein determining the third shared exponent value comprises, upon determining that the first shared exponent value is greater than or equal to the second shared exponent value, using the first shared exponent value as the third shared exponent value, and, upon determining that the first shared exponent value is less than the second shared exponent value, using the second shared exponent value as the third shared exponent value.

18. The method of claim 10, wherein a number of bits used to represent the mantissa values stored in the data structure for the shared exponent floating point data type is less than a number of bits used to represent the third shared exponent value.

19. A system comprising:
a set of processing units; and
a non-transitory machine-readable medium storing instructions that when executed by at least one processing unit in the set of processing units cause the at least one processing unit to:

determine a first shared exponent value based on an exponent value of each floating point value in a first subset of a plurality of floating point values;

determine a second shared exponent value based on an exponent value of each floating point value in a second subset of the plurality of floating point values;

determine a third shared exponent value based the first shared exponent value and the second shared exponent value;

determine a first difference value based on the first shared exponent value and the third shared exponent value;

determine a second difference value based on the second shared exponent value and the third shared exponent value;

determine a sign value and a mantissa value for each floating point value in the plurality of floating point values;

store, in a data structure for a shared exponent floating point data type, the sign value and the mantissa value for each floating point value in the plurality of floating point values, the third shared exponent value, the first difference value, and the second difference value; and providing the data structure as an input to a set of hardware components, the set of hardware components configured to perform a set of operations on the plurality of floating point values based on the data structure for the shared exponent floating point data type and generate an output based on the set of operations, the set of hardware components comprising a set of multipliers for performing multiplication operations on the mantissa values of the plurality of floating point values to generate a plurality of products, a first set of shifters for performing shifting operations on the plurality of products based on the first difference value and the second difference value to generate a first plurality of shifted values, a first set of adders for adding the first plurality of shifted values to generate a plurality of sums, a second set of shifters for performing shifting operations on the plurality of sums to generate a second plurality of shifted values, and a second set of adders for adding the second plurality of shifted values to generate a set of sums.

20. The system of claim 19, wherein the instructions further cause the at least one processing unit to:
- determine a first set of difference values based on the first shared exponent value and the exponent value of each floating point number in the first subset of the plurality of floating point values;
- determine a second set of difference values based on the second shared exponent value and the exponent value of each floating point number in the second subset of the plurality of floating point values; and
- store, in the data structure for the shared exponent floating point data type, the first set of different values and the second set of difference values.

* * * * *